(12) United States Patent
Kowalik-Seidl et al.

(10) Patent No.: US 12,376,334 B2
(45) Date of Patent: Jul. 29, 2025

(54) SEMICONDUCTOR DEVICE

(71) Applicant: Infineon Technologies Dresden GmbH & Co. KG, Dresden (DE)

(72) Inventors: Katarzyna Kowalik-Seidl, Unterhaching (DE); Armin Tilke, Dresden (DE); Markus Wiesinger, Dresden (DE)

(73) Assignee: Infineon Technologies Dresden GmbH & Co. KG, Dresden (DE)

(*) Notice: Subject to any disclaimer, the term of this patent is extended or adjusted under 35 U.S.C. 154(b) by 475 days.

(21) Appl. No.: 17/966,222

(22) Filed: Oct. 14, 2022

(65) Prior Publication Data
US 2023/0119393 A1    Apr. 20, 2023

(30) Foreign Application Priority Data
Oct. 15, 2021 (EP) .................................. 21202829

(51) Int. Cl.
*H10D 30/66* (2025.01)
*H03K 17/0812* (2006.01)
(Continued)

(52) U.S. Cl.
CPC ..... *H10D 30/668* (2025.01); *H03K 17/08122* (2013.01); *H10D 30/611* (2025.01);
(Continued)

(58) Field of Classification Search
CPC .. H10D 30/668; H10D 30/611; H10D 62/111; H10D 62/126; H10D 62/127;
(Continued)

(56) References Cited

U.S. PATENT DOCUMENTS 11,158,627 B2 * 10/2021 Feil .................... H03K 17/0822
2012/0025874 A1   2/2012 Saikaku et al.
(Continued)

FOREIGN PATENT DOCUMENTS

| EP | 1525621 A2 | 4/2005 |
| WO | 03103056 A2 | 12/2003 |
| WO | 03103056 A3 | 2/2004 |

*Primary Examiner* — Igwe U Anya
(74) *Attorney, Agent, or Firm* — Murphy, Bilak & Homiller, PLLC

(57) ABSTRACT

A semiconductor device includes a semiconductor body having first and second opposing surfaces in a vertical direction, and transistor cells at least partly integrated in the semiconductor body. Each transistor cell includes first and second source regions, first and second body regions, a drift region separated from the respective source region by the corresponding body region, a first gate electrode, and a control electrode. The drift region is arranged between the first and the second body region in a horizontal direction that is perpendicular to the vertical direction and extends from the first surface into the semiconductor body in the vertical direction. The first gate electrode is configured to provide a control signal for switching the transistor cell. The control electrode is configured to provide a control signal for controlling a JFET formed by the first body region, the drift region, and the second body region.

20 Claims, 7 Drawing Sheets

(51) Int. Cl.
  *H10D 30/60* (2025.01)
  *H10D 62/10* (2025.01)
  *H10D 62/17* (2025.01)
  *H10D 64/00* (2025.01)
  *H10D 84/00* (2025.01)

(52) U.S. Cl.
  CPC ......... *H10D 62/111* (2025.01); *H10D 62/126* (2025.01); *H10D 62/127* (2025.01); *H10D 62/393* (2025.01); *H10D 64/117* (2025.01); *H10D 84/141* (2025.01)

(58) Field of Classification Search
  CPC .. H10D 62/393; H10D 64/117; H10D 84/141; H03K 17/08122
  USPC ........................................................ 257/170
  See application file for complete search history.

(56) References Cited

U.S. PATENT DOCUMENTS

| | | |
|---|---|---|
| 2012/0049898 A1 | 3/2012 | Mauder et al. |
| 2016/0240614 A1 | 8/2016 | Okuhata et al. |
| 2017/0250685 A1 | 8/2017 | Bina et al. |
| 2021/0083061 A1* | 3/2021 | Darwish .............. H10D 62/127 |

* cited by examiner

SEMICONDUCTOR DEVICE

TECHNICAL FIELD

The instant disclosure relates to a semiconductor device, in particular to an arrangement comprising a transistor device having an improved short circuit robustness.

BACKGROUND

Semiconductor devices such as insulated gate power transistor devices, e.g., power MOSFETs (Metal Oxide Semiconductor Field-Effect Transistors), are widely used as electronic switches in various types of electronic applications. There exists a risk of short circuit events occurring during the use of the device.

It is desirable to provide a semiconductor device having an improved robustness with regard to short circuits.

SUMMARY

One example relates to a semiconductor device. The semiconductor device includes a first surface and a second surface opposite to the first surface in a vertical direction, a plurality of transistor cells at least partly integrated in the semiconductor body, each transistor cell including a first and a second source region, a first and a second body region, a drift region separated from the first source region by the first body region, and from the second source region by the second body region, a first gate electrode, and a control electrode, wherein the drift region is arranged between the first and the second body region in a horizontal direction that is perpendicular to the vertical direction and extends from the first surface into the semiconductor body in the vertical direction, the first gate electrode is configured to provide a control signal for switching the transistor cell, and the control electrode is configured to provide a control signal for controlling a JFET formed by the first body region, the drift region, and the second body region.

A method for operating such a semiconductor device includes switching on the plurality of transistor cells by generating a conducting channel by driving the first gate electrode and the second gate electrode, at the same time when switching on the plurality of transistor cells, applying a drive voltage to the control electrode, the drive voltage having a first value, monitoring a current through the plurality of transistor cells, and, when the current through the plurality of transistor cells exceeds a threshold current, reducing the drive voltage applied to the control electrode from the first value to a lower second value.

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
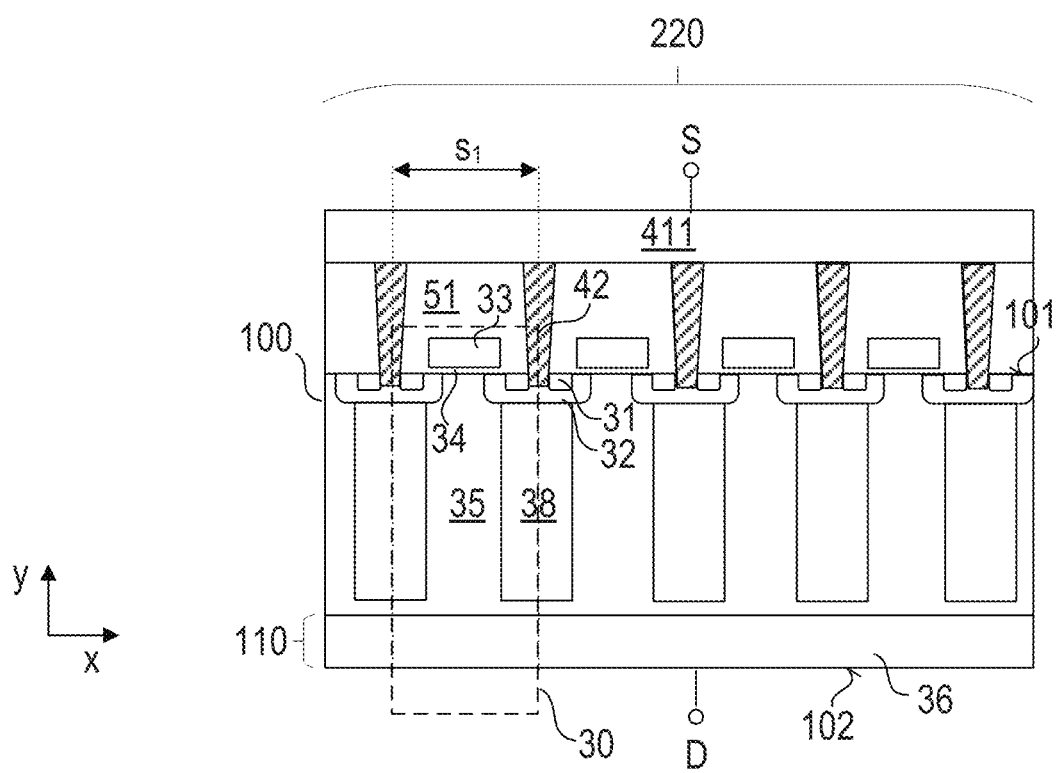
FIG. 1 schematically illustrates a cross sectional view of a semiconductor device.

Referring to FIG. 1, a cross-sectional view of a semiconductor device comprising a semiconductor body 100 is schematically illustrated. The semiconductor body 100 may include a conventional semiconductor material such as, for example, silicon (Si), silicon carbide (SiC), gallium nitride (GaN), gallium arsenide (GaAs), or the like. A transistor device is formed in the semiconductor body 100, the transistor device being arranged in an active region 220 of the semiconductor body 100. In FIG. 1, only a small section of the transistor device is shown. In its active region 220, the semiconductor body 100 includes at least one working transistor cell 30 with a gate electrode 33 that is dielectrically insulated from a body region 32 by a gate dielectric 34. The body region 32 is a doped semiconductor region in the active region 220 of the semiconductor body 100. In the example illustrated in FIG. 1, the body region 32 extends from a first surface 101 into the semiconductor body 100, and the gate electrode 33 is arranged above the first surface 101 of the semiconductor body 100. Each of the transistor cells 30 further includes at least one source region 31 extending from the first surface 101 into the body region 32.

The transistor device illustrated in FIG. 1 further includes a drift region 35 formed in the semiconductor body 100. The drift region 35 adjoins the body region 32 of the at least one transistor cell 30 and forms a pn-junction with the body region 32. The drift region 35 is arranged between the body region 32 of the at least one transistor cell 30 and a semiconductor layer 110. The semiconductor layer 110 is arranged between a second surface 102 of the semiconductor body 100 and the drift region 35. The second surface 102 is arranged opposite to the first surface 101 in a vertical direction y of the semiconductor body 100.

The semiconductor layer 110 comprises a drain region 36 of the same doping type as the drift region 35 and adjoining the second surface 102. Optionally, a horizontal field-stop-region (not specifically illustrated in FIG. 1) of the same doping type as the drift region 35 and the drain region 36, but less highly doped than the drain region 36, may be arranged between the drift region 35 and the drain region 36. That is, the semiconductor layer 110 may be formed by the drain region 36 and an adjoining vertical field-stop-region. Such a vertical field-stop-region may be formed by a single layer or by a plurality of separate sub-layers, e.g., at least two sub-layers. Sub-layers that are arranged closer to the drift region 35 may be less highly doped than sub-layers that are arranged further away from the drift region 35. For example, a doping concentration of a sub-layer that is arranged adjacent to the drift region 35 may be selected from a range of between 1E15 and 1E16 $cm^{-3}$ or lower. A doping concentration of a sub-layer that is arranged adjacent to the drain region 36 may be higher than a doping concentration of a sub-layer that is arranged horizontally above. The doping concentration of the sub-layer that is arranged adjacent to the drain region 36, however, may be lower than a doping concentration of the drain region 36. Generally speaking, a doping concentration of the different sub-layers may increase from the drift region 35 towards the drain region 36.

Still referring to FIG. 1, the transistor device includes at least one vertical compensation region 38 of a doping type complementary to the doping type of the drift region 35. According to one example, the transistor device includes a plurality of transistor cells 30 and each transistor cell 30 includes a vertical compensation region 38 adjoining the body region 32 of the respective transistor cell 30. In a vertical direction y of the semiconductor body 100, which is a direction perpendicular to the first surface 101 and to the second surface 102, the at least one vertical compensation region 38 extends from the body region 32 into the semiconductor body 100 towards the second surface 102 and the semiconductor layer 110. The at least one compensation region 38, however, is optional and can also be omitted.

Still referring to FIG. 1, the transistor device further includes a first source electrode 411. The first source electrode 411 is electrically connected to the source region 31 and the body region 32 of the at least one transistor cell 30 by means of contact plugs 42. The contact plugs 42 may comprise at least one of polysilicon, tungsten, aluminum, copper, and a Ti/TiN barrier liner, for example. This first source electrode 411 forms a source node S or is electrically connected to a source node S of the transistor device. The transistor device further includes a drain node D electrically connected to the drain region 36. A drain electrode electrically connected to the drain region 36 may form the drain node D.

Figure 2:
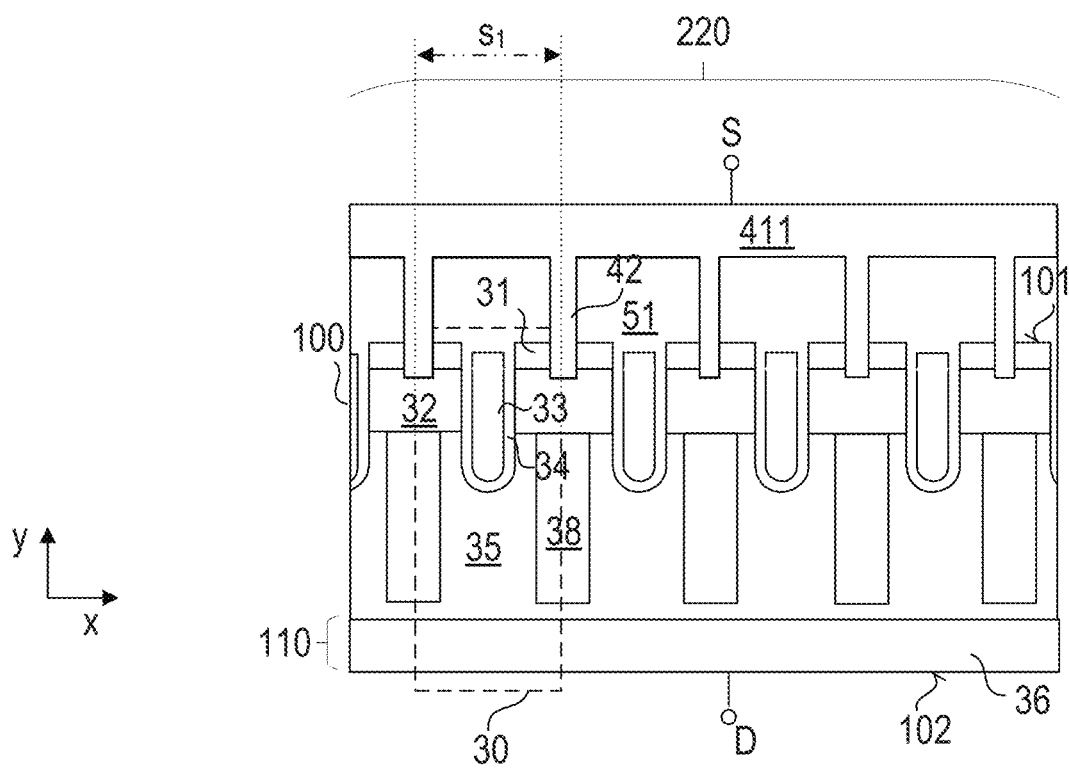
FIG. 2 schematically illustrates a cross sectional view of another semiconductor device.

The transistor device can be an n-type transistor device or a p-type transistor device. The device type is defined by the doping type of the source region 31. In an n-type transistor device, the source region 31 is an n-type region, the body region 32 is a p-type region, the drift region 35, which has a doping type complementary to the doping type of the body region 32, is an n-type region, and the at least one vertical compensation region 38 is a p-type region. In a p-type transistor device, the source region 31 is a p-type region, the body region 32 is an n-type region, the drift region 35 is a p-type region, and the at least one vertical compensation region 38 is an n-type region. The transistor device can be implemented as a MOSFET, for example. In a MOSFET, the drain region 36 has the same doping type as the drift region 35, as has been described above. For example, a doping concentration of the drain region 36 is selected from a range of between 1E18 and 1E19 $cm^{-3}$, 1E18 and 1E20 $cm^{-3}$, or 1E18 and 1E21 $cm^{-3}$, doping concentrations of the drift region 35 and the vertical compensation region 38 are selected from a range of between 1E15 and 5E16 $cm^{-3}$, and a doping concentration of the body region 32 is selected from between 5E16 $cm^{-3}$ and 5E17 $cm^{-3}$. The transistor cells 30 illustrated in FIG. 1 are planar transistor cells. Implementing the transistor cells 30 as planar transistor cells, however, is only one example According to another example, as is illustrated in FIG. 2, the transistor cells 30 are implemented as trench transistor cells. That is, the at least one gate electrode 33 is arranged in a trench that extends from the first surface 101 into the semiconductor body 100.

In the transistor devices explained above, a plurality of transistor cells 30 is connected in parallel. That is, the source regions 31 of these transistor cells 30 are connected to the source node S, the common drain region 36 is connected to the drain node D, and the at least one gate electrode 33 is connected to a gate node.

The contact plugs 42 that are arranged below the first source electrode 411 extend from the source and body regions 31, 32 through an insulation layer 51 that is formed on the top surface 101 of the semiconductor body 100 to the first source electrode 411 to electrically couple the source and body regions 31, 32 to the first source electrode 411. In FIGS. 1 and 2, the insulation layer 51 is illustrated as a single continuous layer which extends from the first surface 101 of the semiconductor body 100 to the first source electrode 411. This, however, is only an example. Often, a gate oxide layer with a thickness of, e.g., 5 nm to 200 nm or 40 nm to 120 nm, is arranged on the first surface 101 of the semiconductor body 100. The insulation layer 51 may comprise this gate oxide layer and an additional layer which is formed on top of this gate oxide layer. This additional layer may comprise an undoped TEOS (tetraethyl orthosilicate) which may have a thickness of about 50 nm to 500 nm, and a doped BPSG (borophosphosilicate glass) having a thickness of about 200 nm to 2 μm or 1100 nm to 1300 nm, for example. The insulation layer 51, therefore, may comprise several sub-layers.

In the semiconductor devices that will be described further with respect to FIGS. 3 and 4, each transistor cell 30 comprises a first and a second source region 311, 312, a first and a second body region 321, 322, a drift region 35 separated from the first source region 311 by the first body region 321, and from the second source region 312 by the second body region 322, a first and a second compensation region 381, 382 of a doping type complementary to the doping type of the drift region 35, the first compensation region 381 extending from the first body region 321 into the semiconductor body 100 in the vertical direction y, and the second compensation region 382 extending from the second body region 322 into the semiconductor body 100 in the vertical direction y. As is schematically illustrated in the figures, two neighboring transistor cells 30 share a body region 32 and a compensation region 38. Or, in other words, the first body region 321 and the first compensation region 381 of a first transistor cell 30 directly adjoin the second body region 322 and the second compensation region 382 of a second transistor cell 30 arranged on a first side of the first transistor cell 30, and the second body region 322 and the second compensation region 382 of the first transistor cell 30, directly adjoin the first body region 321 and the first compensation region 381 of a third transistor cell 30 arranged on a second side of the first transistor cell 30, opposite the first side. This applies for all of the transistor cells 30 except for the outermost transistor cells 30 which only adjoin one other transistor cell 30.

During the use of a semiconductor device, short circuits may occur. When a short circuit occurs, it is desirable to limit the current through the device to prevent the device from failing. In order to effectively limit the current when a short circuit is detected, the semiconductor devices as illustrated in FIGS. 3 and 4 comprise at least a first gate electrode 331 and a control electrode 332. The first gate electrode 331 is configured to provide a control signal for switching the transistor cell 30. The control electrode 332, on the other hand, is configured to provide a control signal for controlling a JFET that is formed by the first body region 321, the drift region 35, and the second body region 322. For the trench transistor cells 30 as illustrated in FIG. 4, it is sufficient to provide only a first gate electrode 331. The planar transistor cells 30 as illustrated in FIG. 3 additionally comprise a second gate electrode 333 configured to provide a control signal for switching the transistor cell 30.

Figure 3:
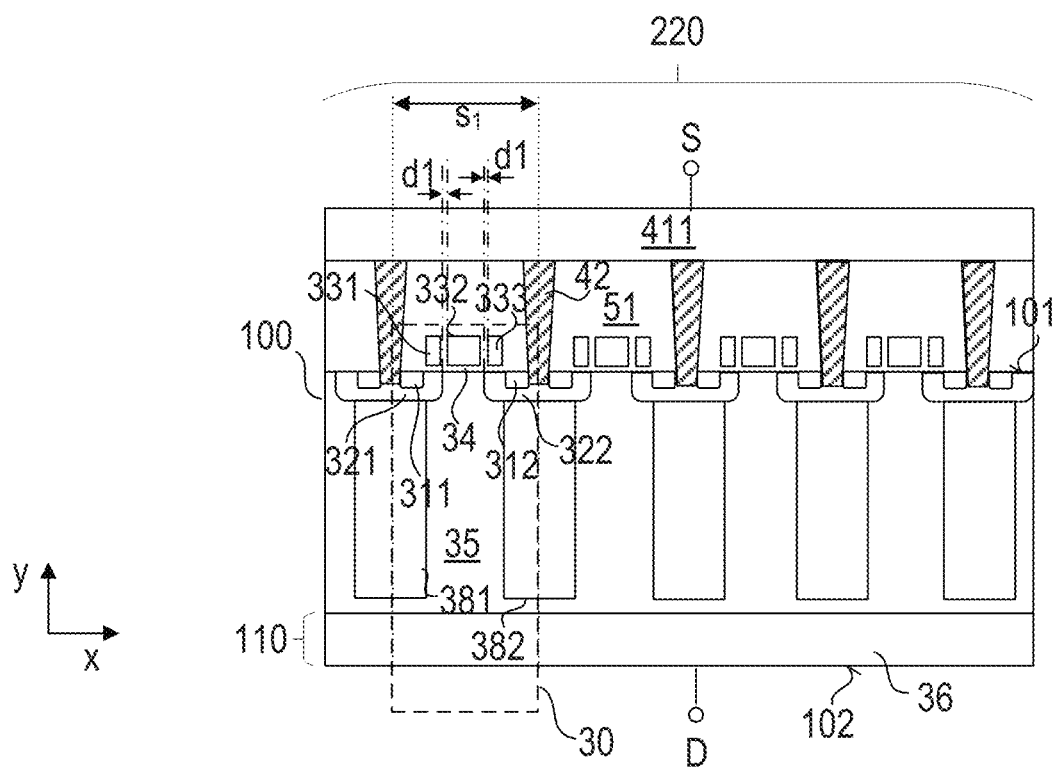
FIG. 3 schematically illustrates a cross sectional view of a semiconductor device according to one example.

Referring to the planar transistor cells 30 of FIG. 3, the first gate electrode 331 is arranged above the first body region 321 in the vertical direction y, and the second gate electrode 333 is arranged above the second body region 322 in the vertical direction y. The control electrode 332 is dielectrically insulated from and arranged between the first gate electrode 331 and the second gate electrode 333 in the horizontal direction x, and dielectrically insulated from and at least partly arranged above the drift region 35 in the vertical direction y. In the example illustrated in FIG. 3, the control electrode 332 is entirely arranged above the drift region 35. That is, the control electrode 332 and the body regions 321, 322 do not overlap in the horizontal direction x. This is illustrated in greater detail in FIG. 7. In this example, the control electrode 332 ends a first distance d1 before the respective body region 321, 322. This first distance d1, however, can also be zero. That is, the control electrode 332 may end exactly above the boundary between the respective body region 321, 322 and the drift region 35. A distance d2 between the control electrode 332 and the first gate electrode 331 in the horizontal direction x may be between 200 nm and 600 nm, and a distance d2 between the control electrode 332 and the second gate electrode 333 in the horizontal direction x may be between 200 nm and 600 nm, for example.

Figure 4:
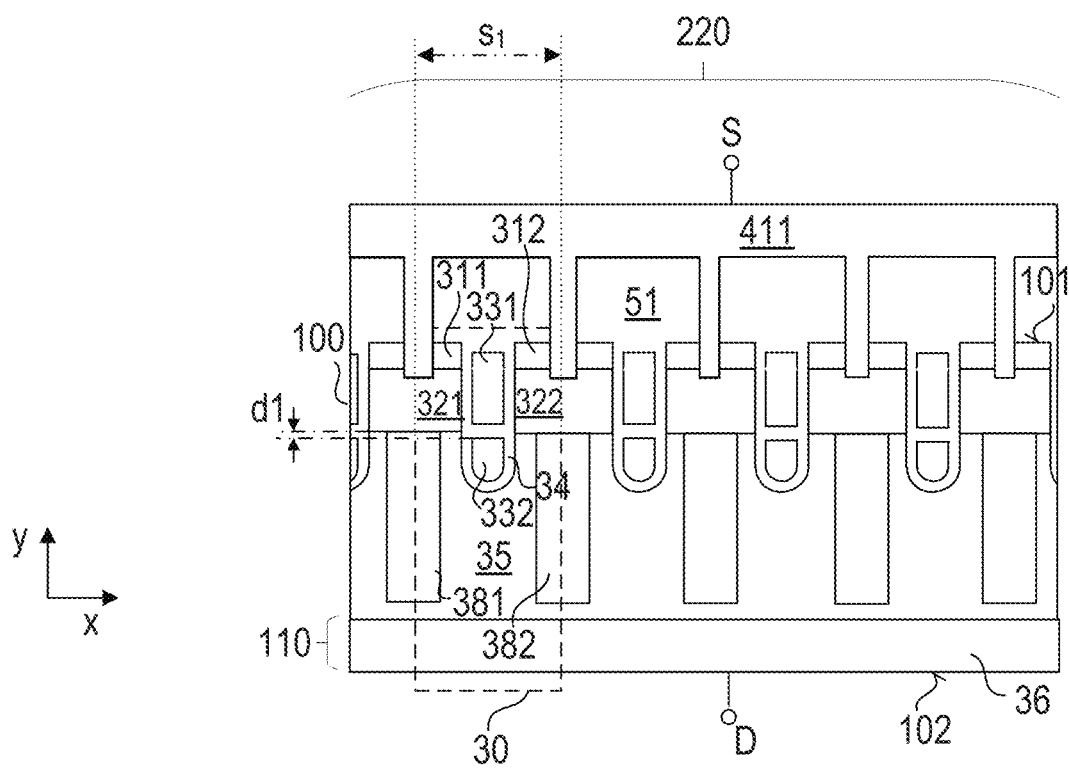
FIG. 4 schematically illustrates a cross sectional view of a semiconductor device according to another example.

A corresponding arrangement for a trench transistor cell is schematically illustrated in FIG. 4. The first gate electrode 331 and the control electrode 332 are arranged in a trench that extends from the first surface 101 into the semiconductor body 100 in the vertical direction y between the first body region 321 and the second body region 322, and between the first source region 311 and the second source region 312. The control electrode 332 is arranged vertically below the first gate electrode 331 such that the first gate electrode 331 is arranged between the control electrode 332 and the first surface 101. In this example, the control electrode 332 does not overlap with the first and second body regions 321, 322 in the vertical direction y. That is, the control electrode 332 in the vertical direction y ends below the body regions 321, 322. A distance d1 between the control electrode 332 and the body regions 321, 322 in the vertical direction y, however, may also be zero.

The arrangements of FIGS. 3, 4 and 7 without an overlap of the control electrode 332 and the first and second body regions 321, 322 will also be referred to as "moderate" design in the following.

Figure 5:
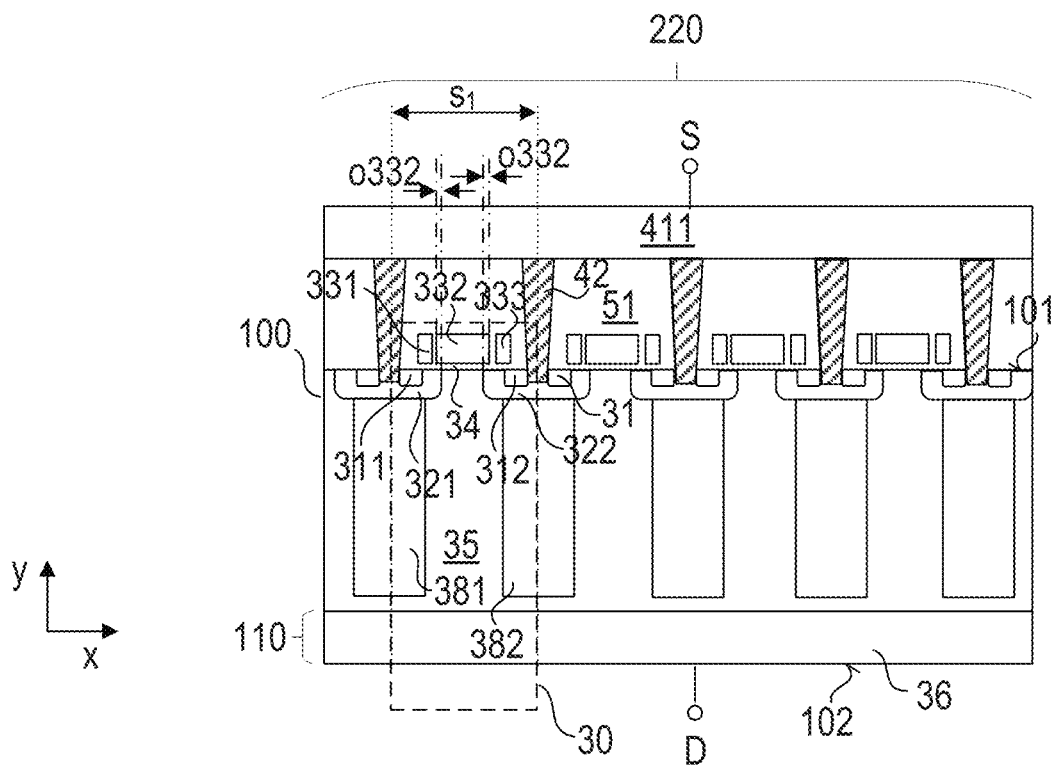
FIG. 5 schematically illustrates a cross sectional view of a semiconductor device according to another example.
Figure 6:
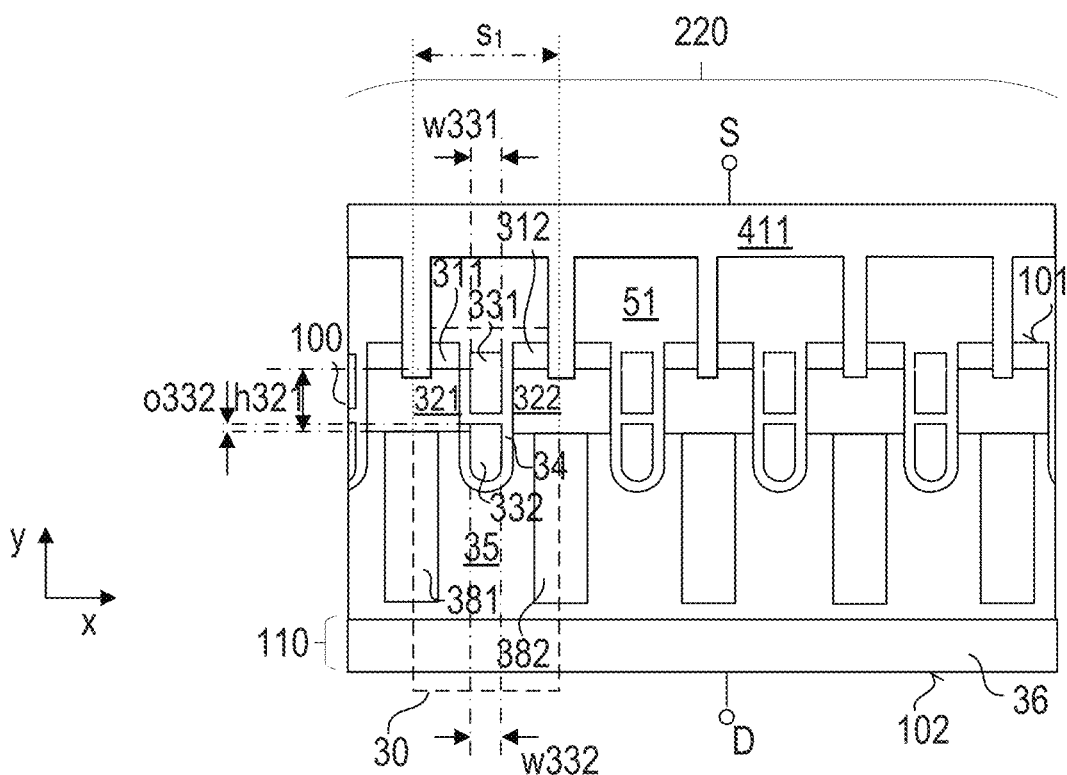
FIG. 6 schematically illustrates a cross sectional view of a semiconductor device according to another example.
Figure 7:
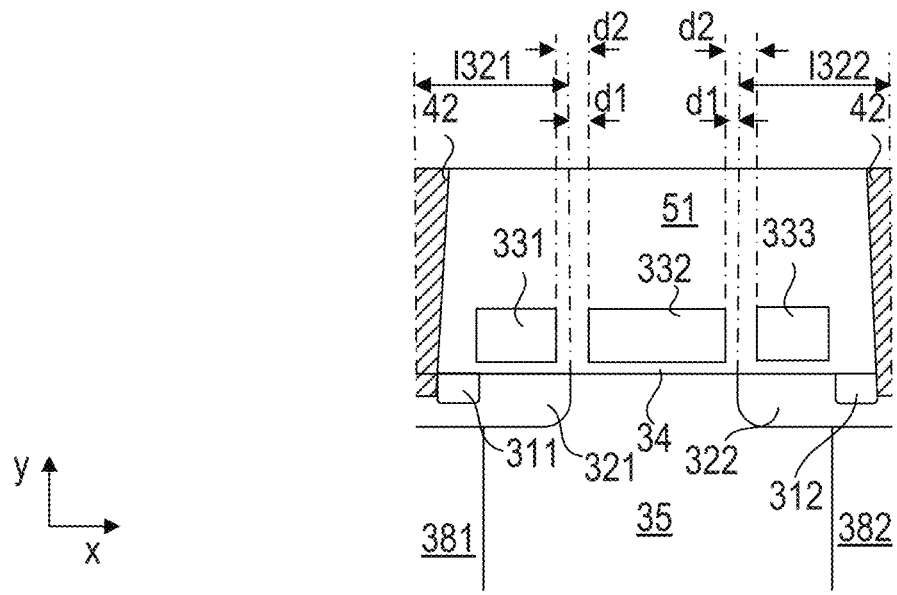
FIG. 7 schematically illustrates a cross sectional view of a section of the semiconductor device of FIG. 3 in greater detail.
Figure 8:
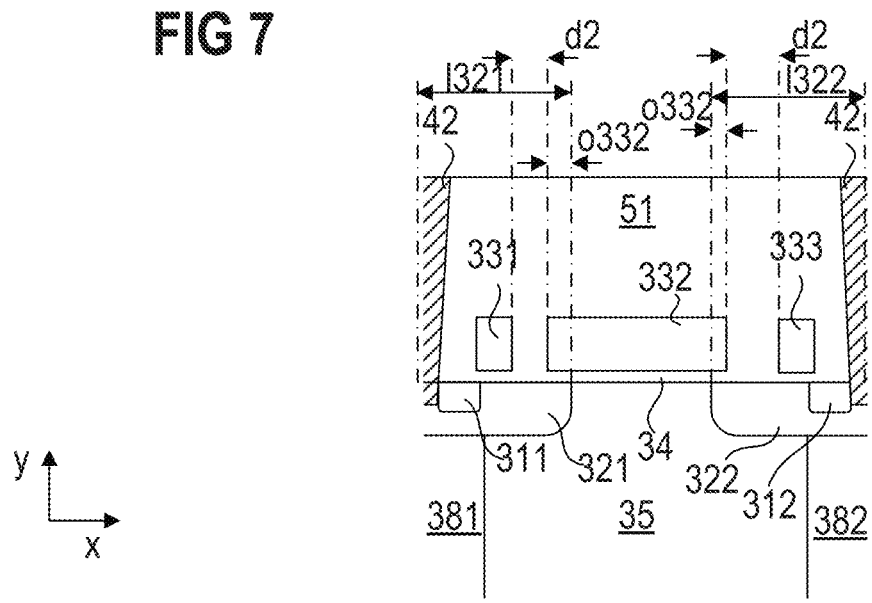
FIG. 8 schematically illustrates a cross sectional view of a section of the semiconductor device of FIG. 5 in greater detail.

Now referring to FIGS. 5, 6 and 8, it is also possible that the control electrode 332 overlaps with the body regions 321, 322 in the horizontal direction (planar transistor cell, FIGS. 5 and 8), or in the vertical direction (trench transistor cell, FIG. 6). Referring to FIGS. 5 and 8, a first end of the control electrode 332 facing the first gate electrode 331 is arranged above the first body region 321 in the vertical direction y, and a second end of the control electrode 332 facing the second gate electrode 333 is arranged above the second body region 322 in the vertical direction y. An overlap o332 between the control electrode 332 and the first body region 321 in the horizontal direction x may be between 1 nm and 300 nm, between 1 nm and 1 µm, or even more than 1 µm in transistor cells having a large pitch, and an overlap o332 between the control electrode 332 and the second body region 321 in the horizontal direction x may be between 1 nm and 300 nm, between 1 nm and 1 m, or even more than 1 µm in transistor cells having a large pitch, for example. That is, the overlap o332 may depend, among other factors, on the size of the transistor cell. According to another example, an overlap o332 between the control electrode 332 and the first body region 321 in the horizontal direction x may be between 1% and 40% of a length 1321 of the first body region 321 in the horizontal direction x, and an overlap o332 between the control electrode 332 and the second body region 321 in the horizontal direction x may be between 1% and 40% of a length 1322 of the second body region 322 in the horizontal direction x, for example (see FIG. 8). Similar to what has been explained with respect to FIGS. 3 and 7 above, the distance d2 between the control electrode 332 and the first gate electrode 331 in the horizontal direction x may be between 200 nm and 600 nm, and a distance d2 between the control electrode 332 and the second gate electrode 333 in the horizontal direction x may be between 200 nm and 600 nm, for example.

Now referring to FIG. 6, a lower end of the control electrode 332 that faces away from the first surface 101 extends into the drift region 35 in the vertical direction y and is dielectrically insulated from the drift region 35, and an upper end of the control electrode 332 that faces the first surface 101 overlaps with the first and second body regions 321, 322 in the vertical direction y. An overlap o332 between the control electrode 332 and the first and second body region 321, 322 may be between 1 nm and 400 nm, for example. Depending on the size of the transistor cell, the overlap o332 may also be larger than 400 nm. According to another example, an overlap o332 between the control electrode 332 and the first body region 321 in the vertical direction y may be between 1% and 40% of a height h321 of the first body region 321 in the vertical direction y, and an overlap o332 between the control electrode 332 and the second body region 321 in the vertical direction y may be between 1% and 40% of a height of the second body region 322 in the vertical direction y which corresponds to the height h321 of the first body region 321 in the vertical direction y, for example.

The arrangements of FIGS. 5, 6 and 8 with an overlap of the control electrode 332 and the first and second body regions 321, 322 will also be referred to as "aggressive" design in the following.

As has already been described above, the control electrode 332 has a different function as compared to the first and second gate electrodes 331, 333. In particular, while the first and second gate electrodes 331, 333 are configured to provide a control signal for switching the transistor cell 30, the control electrode 332 is configured to provide a control signal for controlling a JFET formed by the first body region 321, the drift region 35, and the second body region 322. By controlling the control electrode 332 in an appropriate way, the current through the semiconductor device may be limited, as the JFET is controlled independently, e.g., during short circuit events. This will be explained in more detail in the following.

Figure 9:
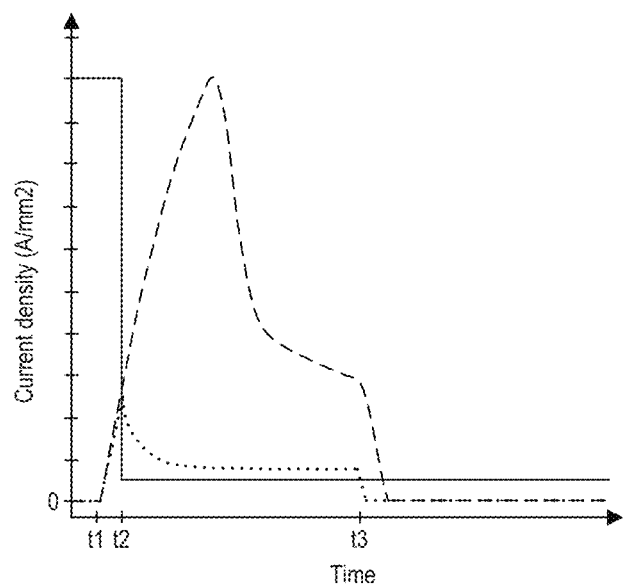
FIG. 9, in a diagram, schematically illustrates the currents through a conventional device as compared to a device according to one example.

Now referring to FIG. 9, the current density through a conventional semiconductor device (comprising only a single gate electrode 33 as illustrated, e.g., in FIGS. 1 and 2) during a short circuit event is schematically illustrated by means of a dashed line. When a short circuit event occurs at a first time instant t1, the current density rises up to a maximum value. The current saturates at this point and then begins to drop. The dotted line in FIG. 9 illustrates the current through a semiconductor device comprising a control electrode 332, as has been described with respect to FIGS. 2 to 8 above. In a first step (not specifically illustrated in FIG. 9), the plurality of transistor cells 30 is switched on by generating a conducting channel by driving the first gate electrode 331 and, if the semiconductor device is a planar device, the second gate electrode 332. At the same time when switching on the plurality of transistor cells 30, a drive voltage is applied to the control electrode 332, the drive voltage having a first value. That is, a current may flow through the JFET formed by the first body region 321, the drift region 35, and the second body region 322. The drive voltage applied to the control electrode 332 is indicated by the solid line in FIG. 9. The current through the plurality of transistor cells 30 is monitored and, when the current through the plurality of transistor cells 30 exceeds a threshold current (e.g., due to a short circuit event), the drive voltage applied to the control electrode 332 is reduced from the first value to a lower second value. Due to this reduction of the drive voltage, at a second time instant t2 shortly after the short circuit event occurred at the first time instant t1, the current through the JFET drops to a value close to zero. By significantly reducing the current through the JFET, the overall current through the transistor cell 30 is reduced (dotted line in FIG. 9). That is, by reducing the drive voltage applied to the control electrode 332 from a first value to a lower second value at a time instant t2, the current through the transistor cell 30 is significantly limited and drops much earlier as compared to semiconductor devices without the control electrode 332. At a third time instant t3 the semiconductor device is switched off such that the current density drops to zero in both cases.

The delay between the occurrence of the short circuit event at the first time instant t1 and the reduction of the drive voltage applied to the control electrode 332 from a first value to a lower second value at the second time instant t2 may be essentially zero (t2−t1−0). The drive voltage applied to the JFET may be reduced as soon as the short circuit event is detected. Often, however, a certain delay is unavoidable, but may be reduced as much as possible. A certain delay, however, is usually acceptable, if the current through the semiconductor device is reduced before the current rises to values that are potentially destructive.

While FIG. 9 illustrates the general principle of the additional control electrode, specific examples of driving schemes for driving the control electrode 332 according to the moderate design (FIG. 10) and according to the aggressive design (FIG. 11) will be described in the following.

Figure 10:
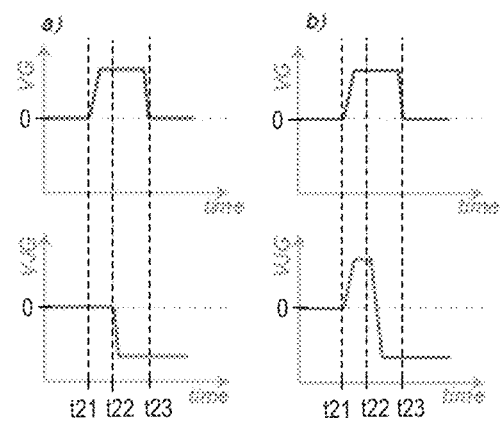
FIG. 10 schematically illustrates control signals for a semiconductor device according to the examples of FIGS. 3 and 4.

Now referring to FIG. 10, exemplary control signals for a semiconductor device according to the examples of FIGS. 3, 4 and 7 (moderate design without overlap) are schematically illustrated. On the left side, in FIG. 10*a*, a first exemplary driving scheme, and on the right side, in FIG. 10*b*, a second exemplary driving scheme for the moderate design are illustrated. The top left diagram schematically illustrates a voltage $V_G$ applied to the first and second gate electrodes 331, 333, while the bottom left diagram schematically illustrates a voltage $V_{JG}$ applied to the control electrode 332. At the beginning, the semiconductor device is non-conducting. That is, the voltage $V_G$ applied to the first and second gate electrodes 331, 333, and the voltage $V_{JG}$ applied to the control electrode 332 are both zero. At a first time instant t21, a positive voltage is applied to the first and second gate electrodes 331, 333 ($V_G$>0). The voltage $V_{JG}$ applied to the control electrode 332 remains at zero in this example. When a short circuit is detected at a second time instant t22, the voltage $V_{JG}$ applied to the control electrode 332 is reduced from its first value (zero) to a lower (negative) value ($V_{JG}$<0), thereby limiting the current through the semiconductor device, as has been described with respect to FIG. 9 above. At a third time instant t23, the semiconductor device is switched off, by reducing the voltage $V_G$ applied to the first and second gate electrodes 331, 333 to zero.

As can be seen at the bottom right side, however, it is also possible to apply a positive voltage $V_{JG}$ to the control electrode 332 at the first time instant t21, when the device is switched on. The diagram on the top right side is identical to the diagram on the top left side and illustrates the voltage $V_G$ applied to the first and second gate electrodes 331, 333 which switches the device on and off. As can be seen in FIG. 10, for the moderate design it is irrelevant whether the voltage $V_{JG}$ applied to the control electrode 332 during normal condition (device switched on, no short circuit event) is zero or greater than zero ($V_{JG}$>0 between t21 and t22). In both cases, however, the voltage $V_{JG}$ applied to the control electrode 332 is reduced to a negative value ($V_{JG}$>0) when a short circuit is detected in order to limit the current through the semiconductor device.

Figure 11:
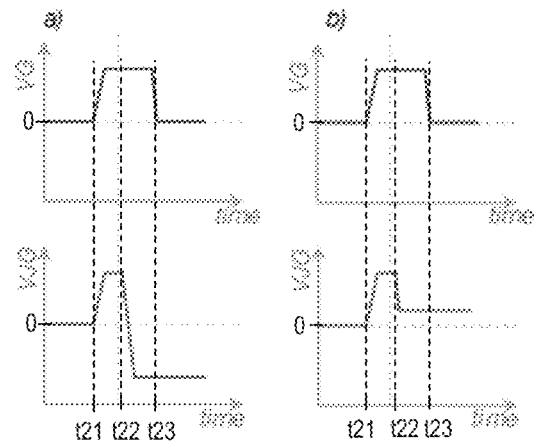
FIG. 11 schematically illustrates control signals for a semiconductor device according to the examples of FIGS. 5 and 6.

Now referring to FIG. 11, an exemplary driving scheme for the aggressive design is schematically illustrated. As the control electrode 332 in this case overlaps with the body regions 321, 322, the voltage $V_{JG}$ applied to the control electrode 332 may equal the voltage $V_G$ applied to the first and second gate electrodes 331, 333 during normal operation of the semiconductor device (device switched on, no short circuit event). That is, the voltage $V_{JG}$ applied to the control electrode 332 is positive between the first time instant t21, when the semiconductor device is switched on, and the second time instant t22, when current limitation by means of the control electrode 332 occurs. If the voltage $V_{JG}$ applied to the control electrode 332 is not the same as the voltage $V_G$ applied to the first and second gate electrodes 331, 333 during normal operation of the semiconductor device, this may negatively affect the performance and regular function of the semiconductor device. This is, because the voltage $V_{JG}$ applied to the control electrode 332 in this case also has an effect on the conducting channel formed in the semiconductor device and may negatively affect the conduction losses of the device. That is, during normal operation the control electrode 332 has essentially the same function as the first and second gate electrode 331, 333.

When a short circuit has been detected, the voltage $V_{JG}$ applied to the control electrode 332 is reduced to a lower value. This can be a negative value, as is schematically illustrated on the bottom left side of FIG. 11 (FIG. 11a, bottom), similar to what has been described with respect to FIG. 10 above. For the aggressive design, however, it is also possible that the positive voltage $V_{JG}$ applied to the control electrode 332 is reduced to a lower value which, however, is still positive, as is schematically illustrated on the bottom right side of FIG. 11 (FIG. 11b, bottom). By reducing the voltage $V_{JG}$ applied to the control electrode 332 to zero or even to negative values, however, the effect is generally more effective and the resulting current limitation is greater. In all cases, however, the device is only switched off entirely at a later time instant t23 by reducing the voltage $V_G$ applied to the first and second gate electrodes 331, 333 to zero.

In order to be able to drive the control electrode 332 independent from the first and second gate electrodes 331, 333, the semiconductor device may comprise a first gate pad for contacting the first and second gate electrodes 331, 333, and a separate second gate pad for contacting the control electrode 332. The first gate pad and the second gate pad may be arranged on the insulation layer 51, horizontally beside and dielectrically insulated from the first source electrode 411. The first gate pad is also dielectrically insulated from the second gate pad.

An electrical connection between the first and second gate pads and the first and second gate electrode 331, 333 or the control electrode, respectively, may be implemented in different ways. Two different examples will be explained by means of FIGS. 12 and 13 in the following.

Figure 12:
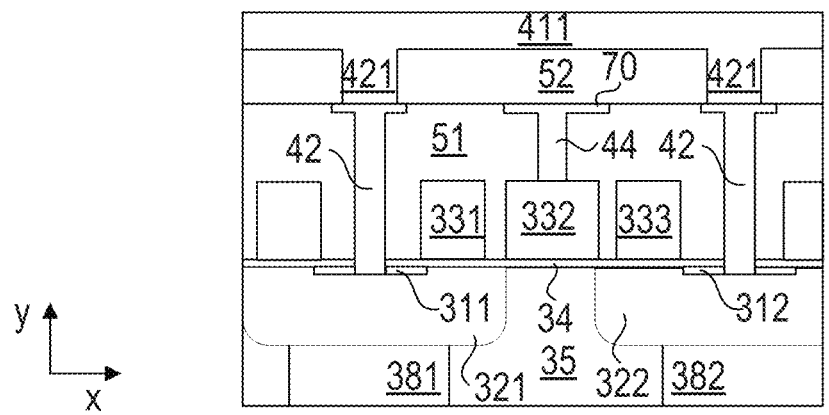
FIG. 12 schematically illustrates a cross sectional view of a semiconductor device according to one example.

With reference to FIG. 12, the first and second gate electrodes 331, 333 may be electrically coupled to the first gate pad in a conventional way. That is, the gate electrodes 331, 333 of the transistor cells 30 may be provided as a plurality of longitudinal semiconductor regions. A length of the first and second gate electrodes 331, 333 in a second horizontal direction perpendicular to the drawing plane may be considerably larger than a respective width in the first horizontal direction x, the horizontal directions x, z being perpendicular to each other. The first and second gate electrodes 331, 333, therefore, may have an elongated form. Each of the first and second gate electrodes 331, 333 may be electrically connected to a so-called gate runner, for example (not specifically illustrated in the Figures). The gate runner may be a circumferential, electrically conducting layer which electrically couples the first and second gate electrodes 331, 333 to the first gate pad. Such a gate runner may overlap each of the longitudinal first and second gate electrodes 331, 333, that is, at least one end of each of the first and second gate electrodes 331, 333 is located below the gate runner in the vertical direction y. According to one example, all ends of the first and second gate electrodes 331, 333 that are overlapped by the gate runner are electrically connected to the gate runner, e.g., by means of contact plugs. However, it is also possible that some ends that are overlapped by the gate runner are not directly connected to the gate runner. "Not directly connected" means that there is no contact plug between the longitudinal end of the respective first and second gate electrodes 331, 333 and the gate runner. However, such longitudinal ends may still be indirectly connected to the gate runner via another one of the first and second gate electrodes 331, 333.

The source electrode 411, as well as the first and second gate pads and the gate runner in this example may be arranged on an additional electrically insulating layer 52 that is arranged on the first insulation layer 51. That is, the second insulation layer 52 may be arranged between the first insulation layer 51 and the source electrode 411, the first gate pad, the second gate pad and the gate runner. The contact plugs 42 electrically coupling the first and second source regions 311, 312 to the source electrode 411 may be extended by additional contact plug portions 421 extending through the second insulation layer 52.

The control electrodes 332 in this example may be electrically coupled to the second gate pad by means of an additional conducting layer 70. This additional conducting layer 70 may be arranged between the first insulation layer 51 and the second insulation layer 52. The additional conducting layer 70 may be electrically coupled to the second gate pad in a similar way as the first and second gate electrodes 331, 333 are coupled to the first gate pad. That is, the additional conducting layer 70 may comprise elongated portions, and a circumferential portion similar to the gate runner (not specifically illustrated) contacting the elongated portions. The circumferential portion may be coupled to the second gate pad by means of one or more contact plugs (not specifically illustrated).

Figure 13:
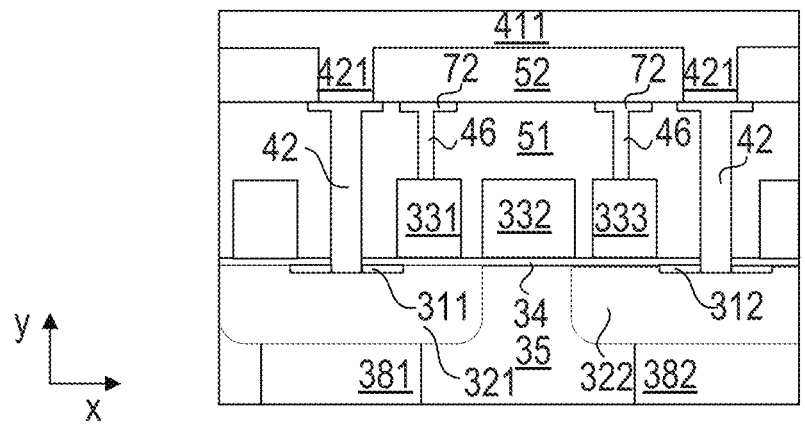
FIG. 13 schematically illustrates a cross sectional view of a semiconductor device according to another example.

According to another example, as is schematically illustrated in FIG. 13, the control electrodes 332 of the plurality of transistor cells 30 may be electrically coupled to the second gate pad by means of a gate runner, similar to what has been described with respect to the first and second gate electrodes 331, 333 of FIG. 12 above. On the other hand, the first and second gate electrodes 331, 333 in this example may be electrically coupled to the first gate pad via an additional conducting layer 72, similar to what has been described with respect to the control electrodes 332 in FIG. 12 above.

The first and second gate electrodes 331, 333 and the control electrode 332, however, may be electrically coupled to a first gate pad and a second gate pad, respectively, in any other suitable way.

According to one example it is possible that during production of the planar semiconductor device, the first and second gate electrodes 331, 333 and the control electrode 332 are formed simultaneously during the same production step. For example, a continuous layer may be formed which may subsequently be structured by means of, e.g., an etching step, resulting in the separate first and second gate electrodes 331, 333 and the control electrode 332. In this case, the first and second gate electrodes 331, 333 and the control electrode 332 may have the same thickness in the vertical direction y. Even further, the gate dielectric 34 below the first and second gate electrodes 331, 333 and below the control electrode 332 may have the same thickness in the vertical direction y. According to another example, however, it is also possible that the first and second gate electrodes 331, 333 are formed in one step and the control electrode 332 is formed in a separate step before or after forming the first and second gate electrodes 331, 333. In this case, the first and second gate electrodes 331, 333 may have the same or a different thickness in the vertical direction y than the control electrode 332. Further, the gate dielectric 34 below the first and second gate electrodes 331, 333 may have the same or a different thickness in the vertical direction y as the gate dielectric 34 below the control electrode 332.

In a semiconductor device comprising trench transistor cells, it is also possible that the gate dielectric 34 in the range of the control electrode 332 has the same or a different thickness than the gate dielectric 34 in the range of the first gate electrode 331. It is also possible that a width w331 of the gate electrode 331 in the horizontal direction x equals a width w332 of the control electrode 332 in the same direction, or that the width w331 of the gate electrode 331 in the horizontal direction x differs from the width w332 of the control electrode 332 in the same direction. For example, if a width w331 of the gate electrode 331 in the horizontal direction x is greater than a width w332 of the control electrode 332 in the same direction, the gate oxide 34 separating the gate electrode 331 from the first and second source regions 311, 312 and first and second body regions 321, 322 may be comparably thin in the horizontal direction x, as compared to the gate oxide 34 separating the control electrode 332 from the first and second body regions 321, 322 and from the drift region 35.

In a semiconductor device comprising a plurality of transistor cells 30, it is possible that each of the plurality of transistor cells 30 equals each of the other transistor cells 30 of the plurality of transistor cells 30. It is, however, also possible, that one or more of the plurality of transistor cells 30 differ from the other transistor cells 30 of the plurality of transistor cells. For example, a distance d1 between the first and second gate electrodes 331, 333 and the control electrode may be different in different transistor cells (moderate planar design). It is also possible that an overlap o332 between the control electrode 332 and the first and the second body regions 321, 322 in the horizontal direction x is different in different transistor cells 30 (aggressive planar design). Even further, it is possible that an overlap o332 of the upper end of the control electrode 332 that faces the first surface 101 with the first and second body regions 321, 322 in the vertical direction y is different for different transistor cells (aggressive trench design), or that a distance d1 between the control electrode 332 and the body regions 321, 322 in the vertical direction y differs for different transistor cells 30 (moderate trench design). The transistor cells 30 may be implemented in any suitable way. For example, the transistor cells 30 may be implemented as simple strip cells. Any other layouts such as, e.g., cylindrical or hexagonal layouts, are also possible.

In the examples illustrated above, the first and second gate electrodes 331, 333 as well as the control electrode 332 have an elongated form. That is, a length of the first and second gate electrodes 331, 333 as well as of the control electrode 332 in the second horizontal direction z is significantly larger than a width of the respective electrodes in the first horizontal direction x. The same applies for the first and second compensation regions 381, 382, which have a length in the second horizontal direction z that is significantly larger than their width in the first horizontal direction x. In FIGS. 2 to 13, the first gate electrodes 331, the second gate electrodes 333, the control electrodes 332, the first compensation regions 381, and the second compensation regions 382 all extend in parallel to each other and perpendicular to the drawing layer.

Figure 14:
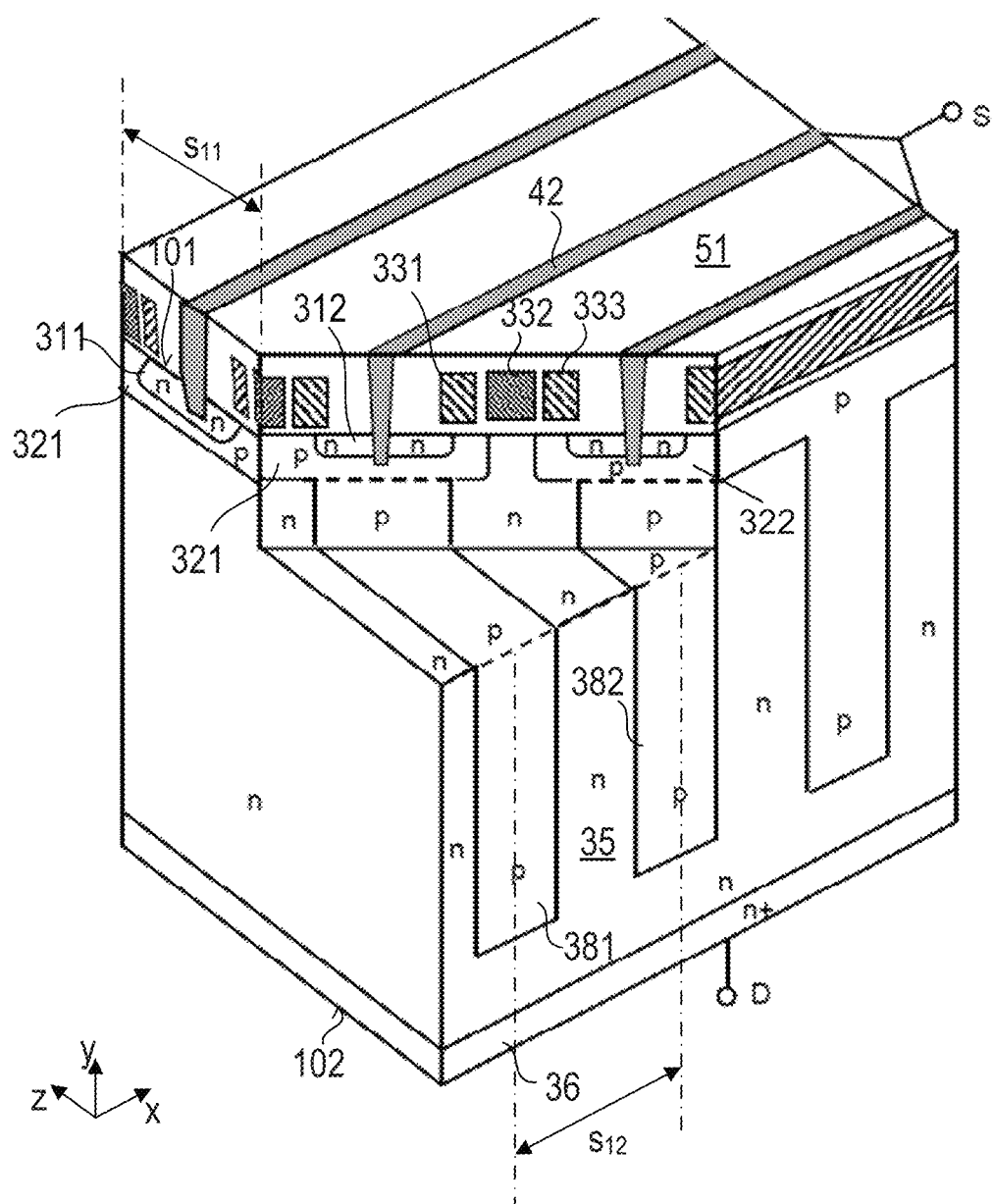
FIG. 14 schematically illustrates in a pictorial cross-sectional view a semiconductor device according to an even further example.

Now referring to FIG. 14, it is alternatively possible that the first compensation region 381 and the second compensation region 382 extend in parallel to each other and perpendicular to the first gate electrodes 331, the second gate electrodes 333, and the control electrodes 332. In the example illustrated in FIG. 14, the first and second compensation regions 381, 382 have a length in the second horizontal direction z that is significantly larger than their width in the first horizontal direction x. However, a length of the first and second gate electrodes 331, 333 as well as of the control electrode 332 in the first horizontal direction x is significantly larger than a width of the respective electrodes in the second horizontal direction z. In particular, the entire structure that is arranged vertically above the drift region 35 is turned by 90° with respect to the first and second compensation regions 381, 382 formed in the drift region 35. That is, a direction in which the first and second source regions 311, 312 as well as the first and a second body regions 321, 322 extend is also turned by 90° with respect to the first and second compensation regions 381, 382 and with respect to what is illustrated in FIGS. 2 to 13. In FIG. 14 this is exemplarily illustrated for a planar transistor cell, but may be similarly implemented for trench transistor cells as well.

In the arrangement illustrated in FIG. 14, a distance $s_{11}$ between the center of a control electrode 332 and the center of an adjacent control electrode 332 (pitch or width of a single transistor cell) may equal the sum $s_{12}$ of the individual widths of a first compensation region 381, a second compensation region 382, and a portion of the drift region 35 arranged between the first compensation region 381 and the second compensation region 382 (pitch or width of the substructure). It is, however, also possible that the distance $s_{11}$ between the center of a control electrode 332 and the center of an adjacent control electrode 332 is smaller or larger than the sum $s_{12}$ of the individual widths of a first compensation region 381, a second compensation region 382, and a portion of the drift region 35 arranged between the first compensation region 381 and the second compensation region 382.

What has been described above with respect to the overlap in trench transistor cells (see, e.g., FIGS. 4 and 6), similarly applies for the arrangement as illustrated in FIG. 14. For trench transistor cells, the "moderate" design as well as the "aggressive" design may be implemented according to what has been described above.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A semiconductor device, comprising:
a semiconductor body comprising a first surface and a second surface opposite to the first surface in a vertical direction; and
a plurality of transistor cells at least partly integrated in the semiconductor body, each transistor cell comprising a first and a second source region, a first and a second body region, a drift region separated from the first source region by the first body region and from the second source region by the second body region, a first gate electrode, and a control electrode,
wherein for each transistor cell:
the drift region is arranged between the first and the second body region in a horizontal direction that is perpendicular to the vertical direction and extends from the first surface into the semiconductor body in the vertical direction,
the first gate electrode is configured to provide a control signal for switching the transistor cell,
the control electrode is configured to provide a control signal for controlling a JFET formed by the first body region, the drift region, and the second body region.

2. The semiconductor device of claim 1, further comprising a first and a second compensation region of a doping type complementary to a doping type of the drift region, wherein the first compensation region extends from the first body region of each transistor cell into the semiconductor body in the vertical direction, and wherein the second compensation region extends from the second body region of each transistor cell into the semiconductor body in the vertical direction.

3. The semiconductor device of claim 1, wherein each transistor cell further comprises a second gate electrode, wherein the first gate electrode is arranged above the first body region in the vertical direction, wherein the second gate electrode is arranged above the second body region in the vertical direction, and wherein the control electrode is dielectrically insulated from and arranged between the first gate electrode and the second gate electrode in the horizontal direction and dielectrically insulated from and at least partly arranged above the drift region in the vertical direction.

4. The semiconductor device of claim 3, wherein for each transistor cell, a first end of the control electrode facing the first gate electrode is arranged above the first body region in the vertical direction and a second end of the control electrode facing the second gate electrode is arranged above the second body region in the vertical direction.

5. The semiconductor device of claim 4, wherein for each transistor cell, an overlap between the control electrode and the first body region in the horizontal direction is between 1 nm and 300 nm and an overlap between the control electrode and the second body region in the horizontal direction is between 1 nm and 300 nm.

6. The semiconductor device of claim 4, wherein for each transistor cell, an overlap between the control electrode and the first body region in the horizontal direction is between 1% and 40% of a length of the first body region in the horizontal direction and an overlap between the control electrode and the second body region in the horizontal direction is between 1% and 40% of a length of the second body region in the horizontal direction.

7. The semiconductor device of claim 3, wherein for each transistor cell, a distance between the control electrode and the first gate electrode in the horizontal direction is between 200 nm and 600 nm and a distance between the control electrode and the second gate electrode in the horizontal direction is between 200 nm and 600 nm.

8. The semiconductor device of claim 3, further comprising a first and a second compensation region of a doping type complementary to a doping type of the drift region, wherein the first compensation region extends from the first body region of each transistor cell into the semiconductor body in the vertical direction, and wherein the second compensation region extends from the second body region of each transistor cell into the semiconductor body in the vertical direction.

9. The semiconductor device of claim 8, wherein the first compensation region and the second compensation region extend in parallel to each other and perpendicular to the first gate electrodes, the second gate electrodes, and the control electrodes.

10. The semiconductor device of claim 9, wherein a direction in which the first and second source regions and the first and the second body regions extend is turned by 90° with respect to the first and second compensation regions.

11. The semiconductor device of claim 9, wherein a distance between a center of one control electrode and a center of an adjacent control electrode equals the sum of individual widths of the first compensation region, the second compensation region, and a portion of the drift region arranged between the first compensation region and the second compensation region.

12. The semiconductor device of claim 9, wherein a distance between a center of one control electrode and a center of an adjacent control electrode is smaller or larger than a sum of individual widths of the first compensation region, the second compensation region, and a portion of the drift region arranged between the first compensation region and the second compensation region.

13. The semiconductor device of claim 1, wherein the first gate electrode and the control electrode are arranged in a trench that extends from the first surface into the semiconductor body in the vertical direction between the first body region and the second body region and between the first source region and the second source region, and wherein the control electrode is arranged vertically below the first gate electrode such that the first gate electrode is arranged between the control electrode and the first surface.

14. The semiconductor device of claim 13, wherein at least a lower end of the control electrode that faces away from the first surface extends into the drift region in the vertical direction and is dielectrically insulated from the drift region.

15. The semiconductor device of claim 14, wherein an upper end of the control electrode that faces the first surface overlaps with the first and second body regions in the vertical direction.

16. The semiconductor device of claim 15, wherein an overlap between the control electrode and the first and second body region is between 1 nm and 400 nm.

17. The semiconductor device of claim 15, wherein an overlap between the control electrode and the first and second body region is between 1% and 40% of a height of the first and second body region in the vertical direction.

18. The semiconductor device of claim 1, further comprising a drain region of the same doping type as the drift region and adjoining the second surface.

19. A method of operating a semiconductor device that includes a semiconductor body comprising a first surface and a second surface opposite to the first surface in a vertical direction and a plurality of transistor cells at least partly integrated in the semiconductor body, each transistor cell comprising a first and a second source region, a first and a second body region, a drift region separated from the first source region by the first body region and from the second source region by the second body region, a first gate electrode, and a control electrode, wherein the drift region is arranged between the first and the second body region in a horizontal direction that is perpendicular to the vertical direction and extends from the first surface into the semiconductor body in the vertical direction, wherein the first gate electrode is configured to provide a control signal for switching the transistor cell, wherein the control electrode is configured to provide a control signal for controlling a JFET formed by the first body region, the drift region, and the second body region, the method comprising:
  switching on the plurality of transistor cells by generating a conducting channel by driving the first gate electrode;
  at the same time when switching on the plurality of transistor cells, applying a drive voltage to the control electrode, the drive voltage having a first value;
  monitoring a current through the plurality of transistor cells; and
  when the current through the plurality of transistor cells exceeds a threshold current, reducing the drive voltage applied to the control electrode from the first value to a lower second value.

20. The method of claim 19, wherein the first value of the drive voltage is positive and the second value is negative, or the first value of the drive voltage is positive and the second value is positive, or the first value of the drive voltage is zero and the second value is negative.

* * * * *